(12) United States Patent
Jiang et al.

(10) Patent No.: US 8,498,604 B2
(45) Date of Patent: Jul. 30, 2013

(54) DOUBLE BALANCED MIXER

(75) Inventors: Xin Jiang, Chelmsford, MA (US); Michael Koechlin, Chelmsford, MA (US)

(73) Assignee: Hittite Microwave Corporation, Chelmsford, MA (US)

( * ) Notice: Subject to any disclaimer, the term of this patent is extended or adjusted under 35 U.S.C. 154(b) by 14 days.

(21) Appl. No.: 13/134,968

(22) Filed: Jun. 22, 2011

(65) Prior Publication Data

US 2011/0312295 A1 Dec. 22, 2011

Related U.S. Application Data

(60) Provisional application No. 61/398,149, filed on Jun. 22, 2010.

(51) Int. Cl.
*H04B 1/26* (2006.01)
*H03D 7/14* (2006.01)

(52) U.S. Cl.
CPC .................................. *H03D 7/1441* (2013.01)
USPC ............ 455/326; 455/313; 455/323; 455/333

(58) Field of Classification Search
USPC .................. 455/313, 319, 323, 325, 326, 333
See application file for complete search history.

(56) References Cited

U.S. PATENT DOCUMENTS

| | | | |
|---|---|---|---|
| 4,449,245 A * | 5/1984 | Rabe | 455/319 |
| 4,800,344 A * | 1/1989 | Graham | 333/25 |
| 5,060,298 A * | 10/1991 | Waugh et al. | 455/326 |
| 5,061,910 A | 10/1991 | Bouny | |
| 5,513,390 A * | 4/1996 | Vice | 455/323 |
| 5,551,074 A * | 8/1996 | Vice | 455/326 |
| 5,732,345 A * | 3/1998 | Vice | 455/333 |
| 6,026,286 A * | 2/2000 | Long | 455/327 |
| 6,057,714 A * | 5/2000 | Andrys et al. | 327/105 |
| 6,144,236 A * | 11/2000 | Vice et al. | 327/113 |
| 6,275,689 B1 | 8/2001 | Gill | |
| 6,292,070 B1 | 9/2001 | Merrill | |
| 6,683,510 B1 | 1/2004 | Padilla | |
| 6,819,199 B2 | 11/2004 | Burns et al. | |
| 6,993,312 B1 | 1/2006 | Salib | |
| 7,035,616 B2 * | 4/2006 | Reynolds | 455/326 |
| 7,068,122 B2 | 6/2006 | Weng et al. | |
| 7,072,636 B2 * | 7/2006 | Dobrovolny | 455/313 |

(Continued)

OTHER PUBLICATIONS

Chen et al., Novel Broadband Planar Balun Using Multiple Coupled Lines, IEEE, Microwave Symposium Digest, 2006, IEEE MTT-S International, pp. 1571-1574.

(Continued)

*Primary Examiner* — Duc M Nguyen
(74) *Attorney, Agent, or Firm* — Iandiorio Teska & Coleman, LLP

(57) ABSTRACT

An improved double balanced mixer is provided which in one embodiment includes a first balun for receiving a first single input and providing a first balanced output having two ports, a second balun for receiving a second single input and providing a second balanced output having two ports, and a balanced mixer core responsive to the first and second balanced outputs to provide a mixed signal from the first and second single inputs. The first balun includes an RC network coupled between at least one of the ports of the first balanced output and one of ground and a common mode node of the first balun to improve the linearity of the double balanced mixer.

19 Claims, 15 Drawing Sheets

U.S. PATENT DOCUMENTS

| | | | |
|---|---|---|---|
| 7,197,293 | B2 | 3/2007 | Vice |
| 7,250,828 | B2 | 7/2007 | Erb |
| 7,580,693 | B2 * | 8/2009 | Rohde et al. ............ 455/326 |
| 7,880,557 | B2 | 2/2011 | Jiang |
| 8,280,338 | B2 * | 10/2012 | Joos et al. ............ 455/323 |
| 2002/0163375 | A1 | 11/2002 | Wu et al. |
| 2005/0088252 | A1 | 4/2005 | Burns et al. |
| 2008/0045162 | A1 | 2/2008 | Rofougaran et al. |
| 2008/0150688 | A1 | 6/2008 | Burr |
| 2008/0258838 | A1 | 10/2008 | Oshima |
| 2009/0015465 | A1 | 1/2009 | Kanaya |

OTHER PUBLICATIONS

Trifunović et al., Review of Printed Marchand and Double Y Baluns: Characteristics and Application, IEEE Transactions on Microwave Theory and Techniques, Vo. 42, No. 8, Aug. 1994, pp. 1454-1462.

Lin et al. An Ultra-Broadband Doubly Balanced Monolithic Ring Mixer for Ku- to Ka-band Applications, IEEE Microwave and Wireless Components Letters, vol. 17, No. 10, Oct. 2007, pp. 733-735.

Gavela et al., A Small Size LTCC Balun for Wireless Applications, Proceedings of the 34$^{th}$ European Microwave Conference 2004, pp. 373-376.

Marchand, Nathan, Transmission Line Conversion Transformers, Electronics vol. 17, Dec. 1944, pp. 142-145.

Written Opinion from the International Searching Authority for International Application No. PCT/US2010/000759, dated May 17, 2010, 7 pgs. (unnumbered).

Rohde, Ulrich L., Reconfigurable and Cost-Effective FET Mixer, Wireless and Microwave Technology Conference, 2009, pp. 1-7 (unnumbered).

Written Opinion of the International Searching Authority, Oct. 25, 2011, International Application No. PCT/US2011/001110, 7 pgs. (unnumbered).

Ryynanen et al., A Dual-Band RF Front-End for WCDMA and GSM Applications, IEEE Journal of Solid State Circuits, vol. 36, No. 8, Aug. 2001. (Retrieved from the internet: URL:http://lib.tkk.fi/Diss/2002/isbn9512261510/article3.pdf>, pp. 1198-1204.

* cited by examiner

DOUBLE BALANCED MIXER

RELATED APPLICATIONS

This application hereby claims the benefit of and priority to U.S. Provisional Application Ser. No. 61/398,149, filed on Jun. 22, 2010 under 35 U.S.C. §§119, 120, 363, 365, and 37 C.F.R. §1.55 and §1.78, which application is incorporated herein by reference.

FIELD OF THE INVENTION

This invention relates to a double balanced mixer.

BACKGROUND OF THE INVENTION

In communication and other electric systems, a signal at one radio frequency (RF) band often needs to be converted to another intermediate frequency (IF) band or vice verse using circuits called frequency converters or mixers. During this signal frequency conversion process at a mixer, the ratio between output signal power level after the conversion and input signal power level before the conversion is called conversion gain (CG), which measures the efficiency of the conversion process. The operating bandwidth of a mixer is often defined as the frequency bands where conversion gain is maintained at a reasonably high level.

Meanwhile, the output signal of the mixer is distorted and filled with spurious signals because of the non-linearity of the conversion process. One of the key parameters for measuring the linearity of mixer is the third-order intercept point (IP3) of the signal. If this point is measured using the output signal power level as a reference, it is defined as the output third-order intercept point (Output IP3). Similarly, if this point is measured using the input signal power level as reference, it is defined as input third-order intercept point (Input IP3). The difference of the Output IP3 and Input IP3 is the conversion gain of the mixer.

A double balanced mixer is very popular choice for frequency conversion because of its high spur and port-to-port signal leakage suppressions (isolation between ports). However, the minimum output IP3 of passive double balanced mixer within the operating band is usually 3 dB lower than power at local oscillator (LO) port.

Various techniques have been proposed to improve the linearity of the converted signals: U.S. Pat. No. 6,993,312 B1 to Salib, entitled "Double balanced diode mixer with high output third order intercept point", is one example of double balanced mixer with resonant resistor-inductor-capacitor (RLC) circuit across the balanced output ports of the mixer balun, which provide better linearity and IP3 at a specified narrow frequency band because of the resonant nature of the RLC network. U.S. Pat. No. 7,197,293 B2 to Vice, entitled "Absorbing sum signal energy in a mixer", proposed to improve linearity by using a capacitor as a filter connecting the input and output ports and by using a resistor as a load to absorb the spurious between the input and output ports. Some linearity improvement can be achieved at the cost of reduced conversion gain, lower isolation between input and output ports and narrower operating bandwidth. Other ideas were also proposed by Rohde and Poddar in their paper of "Reconfigurable And Cost-Effective FET Mixer", Wireless and Microwave Technology Conference, 2009, pp 1-7, where a tunable capacitor in series with resistor networks were placed between the gate and drain terminals of the non-linear mixing transistor core. In their topology, Gate terminals are driven by in-phase LO signal and Drain terminals are driven by RF and IF ports. Although linearity improved, the conversion gain and port-to-port isolation suffered.

In another approach, U.S. Pat. No. 7,580,693 B2 to Rohde et al. uses a parallel RC network coupled in series of the in-phase gates of a mixing transistor to shape the wave form of the LO input signal with reduced rise and fall times at the mixing transistor gates. This approach will only work for a certain frequency range with parallel RC providing waveform shaping only at certain frequencies. Also, the in-phase driven mixer core sacrifices the balance operation and high isolation as well.

In certain applications, baluns may be used with a double balanced mixer to great advantage. These baluns, which may include a single-ended-to-differential or a single-ended-to-balanced signal converting circuit (balun), have been widely employed in many radio frequency (RF), microwave and millimeter frequency applications. There have been many approaches and topologies proposed in previous works on the designs of baluns to meet various application demands. The Marchand balun, N. Marchand, "Transmission line conversion Transformers", Electronics, vol. 17, pp. 142-145, 1944, has become one of the most popular balun topologies to provide low-loss and wide-band differential signals. An alternative topology is described in U.S. Pat. No. 6,292,070; and is often referred to as a back-wave balun. Both topologies can be realized using either distributed elements or lumped elements. And in both balun approaches, the balun comprises a first and second pair of coupled transmission line sections for distributed topology or pair of coupled transformer sections for lumped-element topology. The distributed topologies usually offer better bandwidth performance than their corresponding lumped-element solutions but at the cost of large circuit area, which corresponds to higher manufacturing cost. There have been several publications: Gavela, "A small size LTCC balun for wireless applications", Proceedings of the European Microwave Conference 2004, pp 373-376; and U.S. Pat. No. 6,819,199, on the size reduction using lumped-element versions for the above two balun topologies.

Many forms of Baluns are known in the art. See: Gavela, "A small size LTCC balun for wireless applications", Proceedings of the European Microwave Conference 2004, pp 373-376; U.S. Pat. No. 6,819,199; Lin, "An Ultra-broadband Doubly Balanced Monolithic Ring Mixers for Ku- to Ka-band Applications", IEEE Microwave and wireless components letters, Vol. 17, No. 10, October, 2007; Trifunovic, "Review of Printed Marchand and Double Y Baluns: Characteristics and Application", IEEE Transactions on Microwave Theory and Techniques, Vol. 42, No. 8, August, 1994; Chen, "Novel Broadband Planar Balun Using Multiple Coupled Lines", Microwave Symposium Digest, 2006, IEEE MTT-S International, pp. 1571-1574, as well as U.S. Pat. No. 6,683,510 B1 to Padilla, U.S. Pat. No. 7,250,828 B2 to Erb, U.S. Pat. No. 7,068,122 B2 to Weng, U.S. Pat. No. 6,275,689 B1 to Gill and U.S. Pat. No. 5,061,910 to Bouny. All of these above references are incorporated by reference herein.

Marchand balun's differential output branches are connected to ground via the second pair of the coupled sections while the back-wave balun's differential outputs are not grounded at the second pair of the coupled section. Therefore, when DC groundings of the differential ports are needed, the Marchand balun approach is preferred, and when non-zero DC biasing is needed for the differential output port, the back-wave balun approach is preferred. In addition, because the fabrication limitations and parasitic effects limit their bandwidth performance, both balun topologies have their own optimum operation frequency bands. Choosing between Marchand and back-wave baluns based on trade-off in DC biasing and bandwidth performance is often made for each specific application and available fabrication process requirements. In addition, the distributed strip-line baluns with tight broadside coupling are often used to improve bandwidth. But those strip-line baluns require multiple metal layers with rigorously controlled three-dimension profiles, which impose greater fabrication difficulties and higher cost for most planar and semiconductor integrate circuit fabrication processes. Single ended-to-balanced circuits (baluns) are bi-directional in concept, i.e., the input can be single ended and be converted to a differential or balanced output or the input can be balanced or differential and the output single-ended.

For certain applications, a hybrid Marchand/back-wave balun provides the desired DC blocking and biasing features that are not achievable using only either a Marchand-type balun or a back-wave-type balun. Exemplary hybrid Marchand/back-wave baluns are disclosed in U.S. Pat. No. 7,880,557, herein incorporated by reference, which is assigned to Hittite Microwave Corporation of Chelmsford, Mass. The hybrid baluns of the '557 patent provide multi-octave bandwidth with balanced amplitude and phase for mixer and other applications, where single-ended-to-differential conversions are critical for overall circuit performance. The hybrid baluns of the '557 patent may be implementable using either distributed coupling lines or lumped elements.

SUMMARY OF THE INVENTION

The invention results from the realization, in part, that to improve the linearity of a double balanced mixer, which in one embodiment includes a balanced mixer core responsive to the balanced outputs from first and second baluns, an RC network is coupled between one or more of the ports of the balanced output of the first balun and either ground or a common mode node of the first balun. Another benefit of this RC network is that the isolation between the ports of the mixer core can be improved at specified frequency without affecting other aspects of the performance of the mixer.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
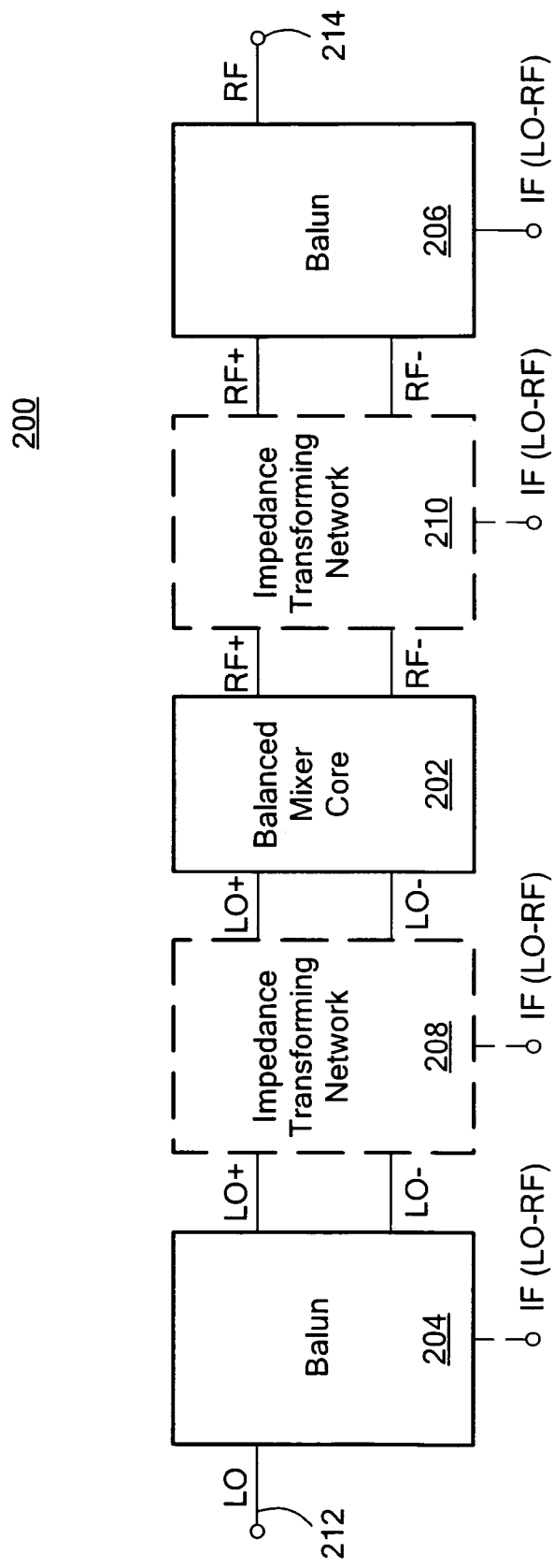
FIG. 1 is a schematic diagram of a prior double balanced mixer.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

A conventional double balance mixer 200, FIG. 1, includes a balanced mixer core 202 being supplied by two baluns 204, 206 which may include various types of baluns, such as a Marchand, back/wave or hybrid balun. There optionally may also be impedance transforming networks 208, 210 as conventionally used. The balanced mixer cores of conventional design can be either diode based or FET based. One input, LO, is provided at port 212; the other input to be mixed, RF, is provided at port 214. These are single ended ports in this embodiment. Hybrid balun 204 provides differential or balanced outputs LO+ and LO− which are delivered to balanced mixer core 202. Hybrid balun 206 receiving input RF at port 214 provides a balanced or differential output RF+ and RF−. This mixer 200 with the use of the hybrid baluns according to this invention provides good isolation of LO and RF and it also provides improved broad band mixed signal output LO-RF, or IF. The IF output being provided at hybrid balun 206 is typically a common mode signal and can be extracted elsewhere. That is, the location of the IF port 216 can be changed according to application requirements. It's possible to extract the IF signal either from the LO side of the balun or from the impedance transforming networks 208 or 210 or from the mixer core 202. The IF signal can also be single ended or balanced or differential.

Optional impedance transforming/matching networks 208, 210 are also shown along with baluns 204, 206 since in many RF and microwave applications the power is transformed from a 50 ohms source single ended to differential or balanced branches that are loaded with complex impedance of non-linear devices such as in balanced mixer or push-pull amplifier designs.

Figure 2:
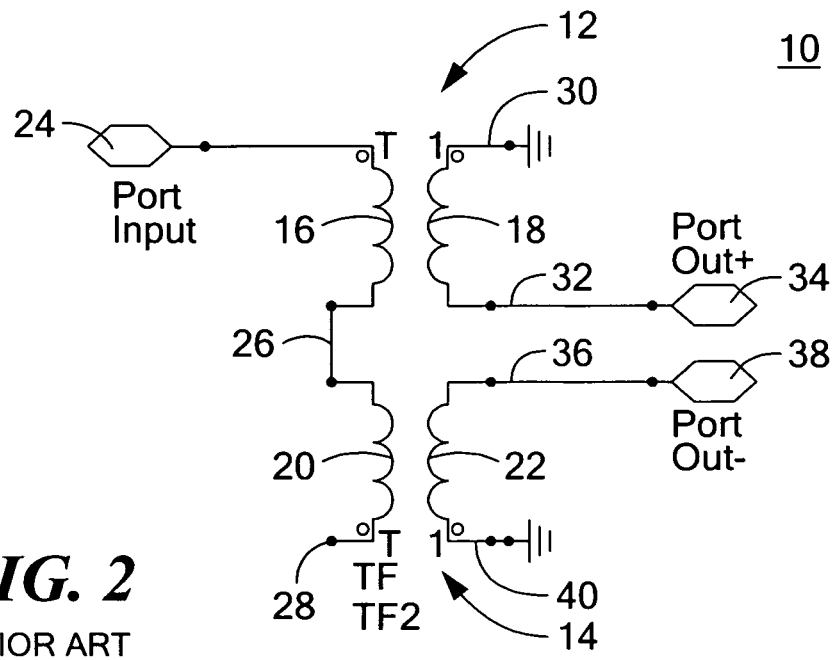
FIG. 2 is a schematic diagram of a prior art lumped Marchand balun.

There is shown in FIG. 2 a conventional prior art Marchand balun 10 using lumped elements. Balun 10 includes a first pair of coupled sections 12 and a second pair of coupled sections 14. Coupled section 12 includes a first primary section 16 and a first secondary section 18. Couple sections 14 include a second primary section 20 and a second secondary section 22. Primary section 16 has one end connected to input port 24 while the other end is connected directly via line 26 to second primary section 20 whose other end is open at 28. First secondary section 18 has one end connected to ground 30 and the other end 32 connected to one of the balanced or differential output ports 34. Second secondary section 22 also has one end 36 connected to the other differential or balanced output port 38. The other end 40 of secondary section 22 is connected to ground. Although the single ended port 24 is referred to as the input port and the differential or balanced ports 34 and 38 are referred to as the output ports, this is not a necessary limitation of the invention, as is the case with every balun both conventional and those involving the invention described herein. The balun in concept can be bi-directional, that is, the single ended port may be the input and the balanced or differential ports may be the output as shown throughout this disclosure but the balanced or differential ports may as well be the inputs and the single ended port may be the output. In FIG. 2, the coupled sections 12 and 14 are formed of lumped elements 16, 18, and 20, 22, respectively. In this case, the section 16 and 18 and 20 and 22 may be referred to as transformer sections.

Figure 3:
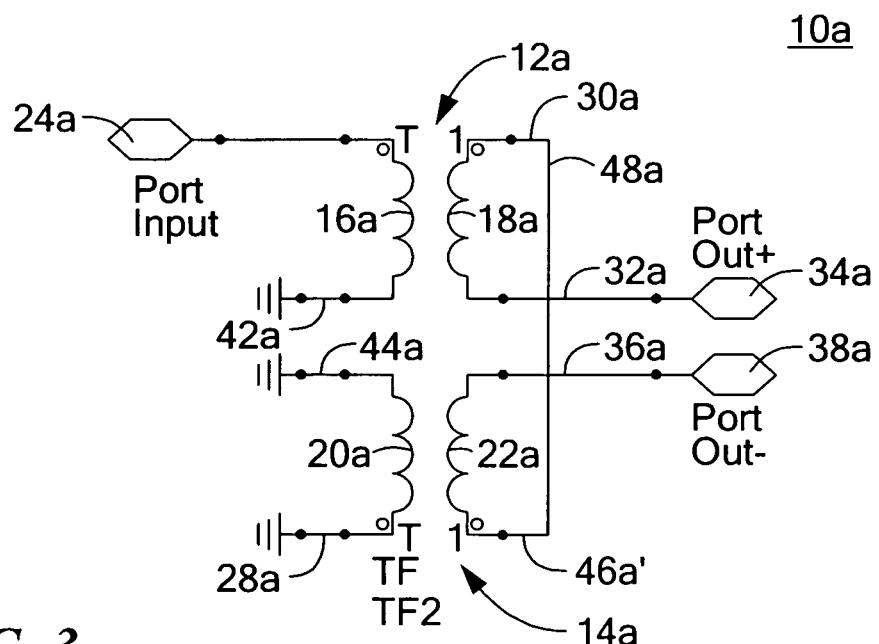
FIG. 3 is a schematic diagram of a prior art lumped back-wave balun.

In contrast to a conventional prior art Marchand balun, a conventional prior art back-wave balun 10a, FIG. 3, has its first primary section 16a, connected to port 24a, but its other end instead of being connected directly to second primary section 20a is connected to ground at 42a and both ends of second primary section 20a are connected to ground at 44a and 28a. The end of each secondary section 18a, and 20a, shown at 32a and 36a are connected to ports 34a and 36a. However, the other ends 30a and 46a are not connected to ground as was the case with the Marchand balun but are connected to each other over line 48a. The baluns of FIGS. 1 and 2 may also be implemented as distributed baluns in which, for example, the sections 16, 18, 20 and 22 would be transmission line sections.

In one application the hybrid balun 50, FIG. 3, of the '557 patent may be included in a balun structure 52 which includes a matching network 54 and an impedance transforming network 56. Hybrid balun 50 may receive at its single ended port 58, an input from matching network 54 which in turn receives a 50 ohm input at terminals 60 and 62. The differential or balanced output at ports 64 and 66 of hybrid balun 50 is provided to impedance transforming network 56 which provides the ultimate output at terminals 68 and 70 to a typical passive load or non-linear device 72.

Figure 4:
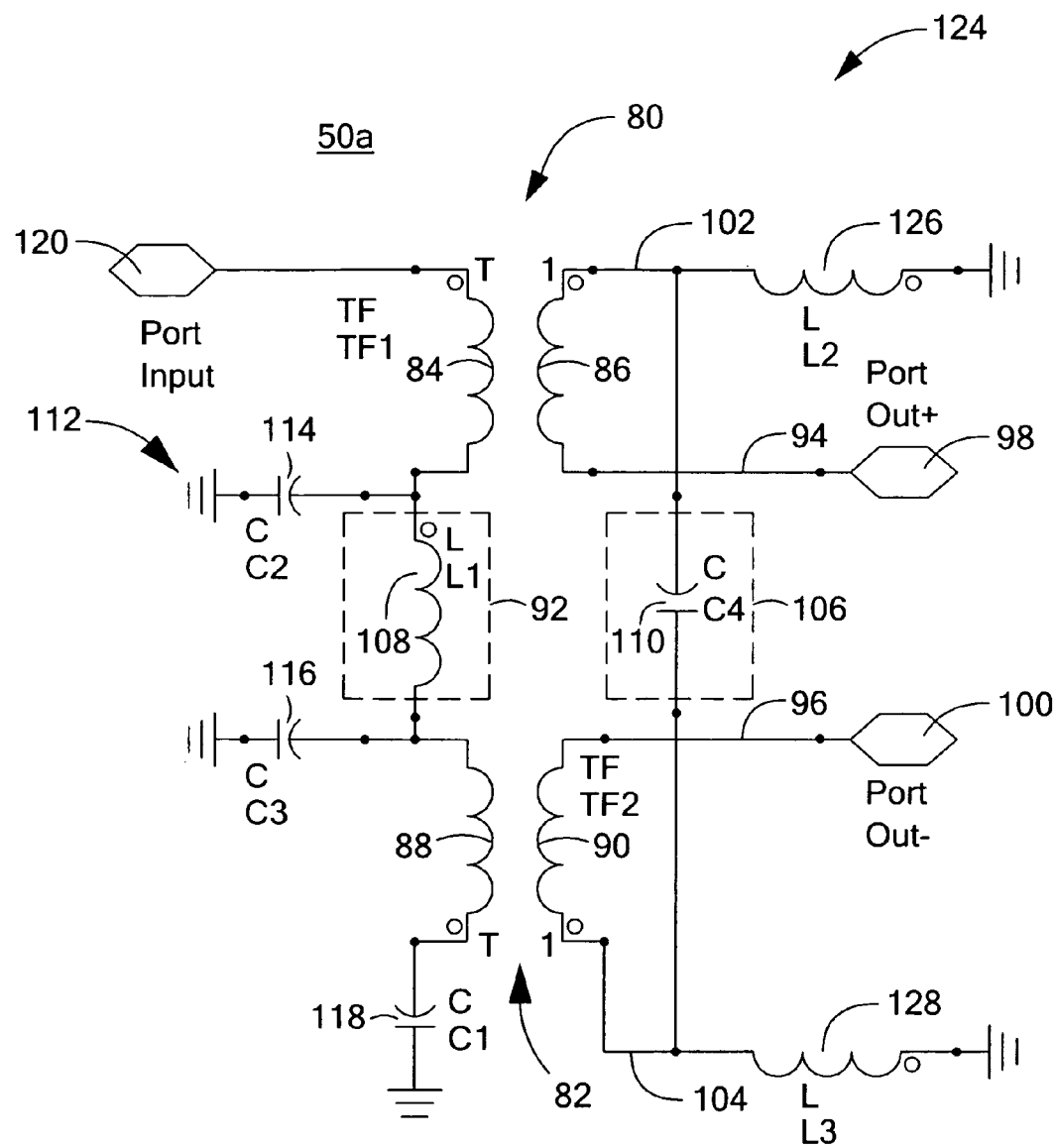
FIG. 4 is a schematic diagram of a lumped hybrid Marchand/back-wave balun which functions as a Marchand balun at low frequency and back-wave balun at high frequency.

A lumped element version of a hybrid balun 50a, according to this invention, FIG. 4, functions as a Marchand type balun at low frequency and as a back-wave balun at high frequency. There is a pair of coupled sections 80 and a pair of coupled sections 82. Coupled sections 80 include a first primary section 84 and a first secondary section 86. The other pair of coupled sections includes a second primary section 88 and a second secondary section 90. Primary sections 84 and 88 are interconnected by a reactance 92. Secondary sections 86 and 90 each have one end 94, 96 connected to ports 98 and 100. The other ends 102, 104 are connected together to a second reactance 106. In FIG. 4, reactance 92 is shown as an inductive reactance 108, while reactance 106 is shown as a capacitive reactance 110. Inductance 108 is a short at low frequency so balun 50a behaves like a Marchand balun but inductance 108 is open at high frequency so then balun 50a functions as a back-wave balun. Capacitive reactance 110 on the other hand acts as a short at high frequency so the device functions as a back-wave balun but an open at low frequency so the device operates as a Marchand balun. There may also be a grounding reactance 112 associated with primary sections 84 and 88 which may include capacitive reactance 114, 116 and 118. Capacitive reactance 114 and 116 are connected from either side of inductive reactance 108 to ground while capacitive reactance 118 is connected from the other end of second primary section 86 to ground. The free end of first primary section 84 is connected to port 120. There may also be an inductive grounding reactance 124 including inductive reactances 126, and 128 associated with first and second secondary sections 86 and 90. Capacitive reactances 114 and 116 are open at low frequency in the nature of Marchand balun and are shorted at high frequency in the nature of a back-wave balun. Inductive reactances 126 and 128 are shorted at low frequency in the nature of a Marchand balun and are open at a high frequency in the nature of back-wave balun. Here again, although port 120 is shown as an input port it may be the output port and although ports 98 and 100 are shown as the output ports they may be in the input ports. Since this is a lumped element version of the hybrid balun of this invention, sections 84, 86, 88 and 90 may be referred to as transformer sections. Reactances 92, 92', 92a, 92'a, and 106, 106', 106a, and 106'a may be implemented, selectively, by the parasitic capacitive reactance and parasitic inductive reactance of the coupled sections.

Figure 5:
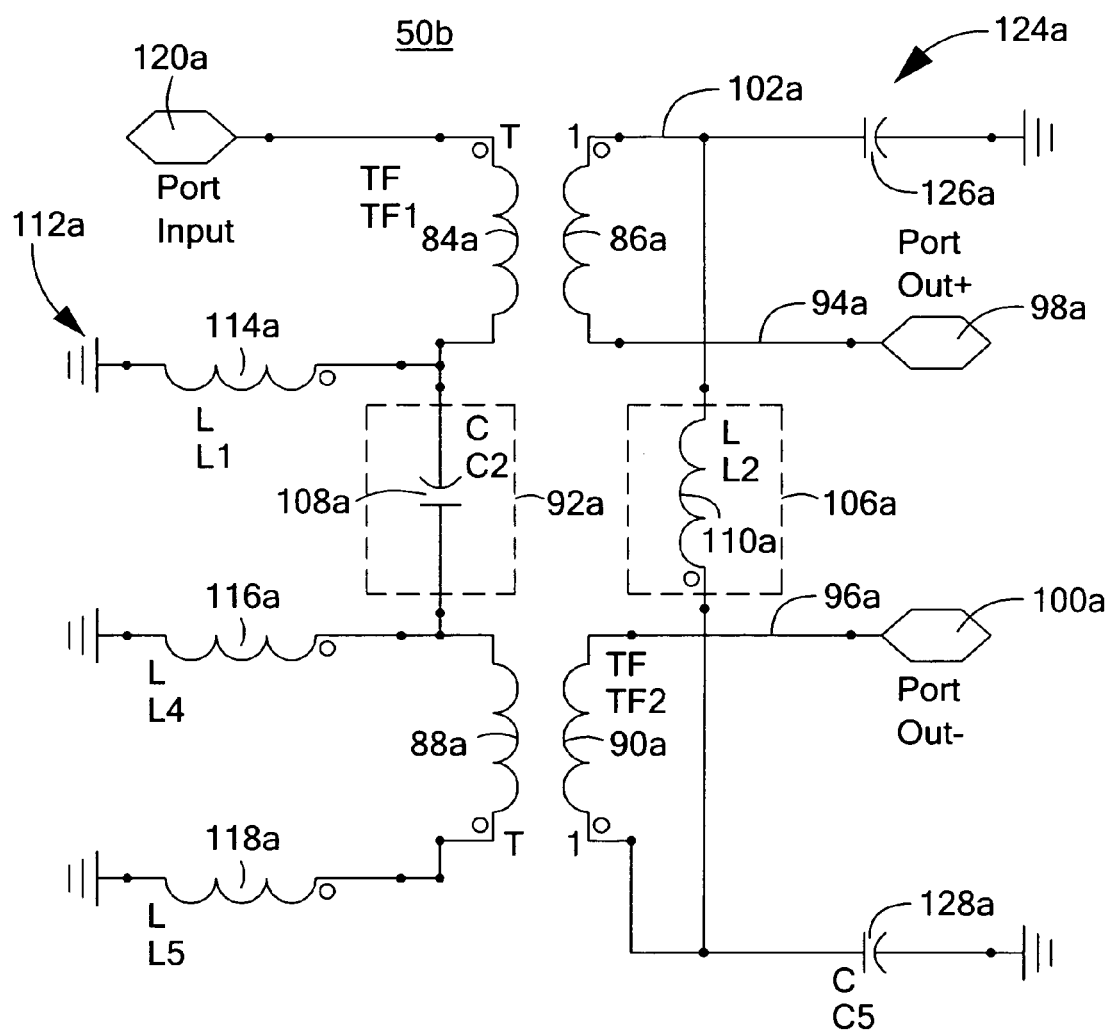
FIG. 5 is a schematic diagram of a lumped hybrid Marchand/back-wave balun which functions as a back-wave balun at low frequency and Marchand balun at high frequency.

By swapping the types of reactances associated with the primary sections and the secondary sections, another hybrid balun of the '557 patent, 50b, FIG. 5, may be constructed wherein it performs as a Marchand type balun at high frequency and a back-wave type balun at low frequency. Hybrid balun 50b is similar to hybrid balun 50a, but here the reactance 92a is implemented with a capacitive reactance 108a and reactance 106a is implemented with an inductive reactance 110a. In addition to swapping the nature of reactances 92a and 106a with respect to their inductive and capacitive natures the grounding reactances 112a and 124a have been swapped in the same fashion so that grounding reactances 114a, 116a, and 118a are now inductive reactances and the grounding reactances 126a and 128a are now capacitive reactances. Here inductive reactances 114a, 116a and 118a provide a short at low frequency in the nature of a back-wave balun and an open at high frequencies in the nature of a Marchand balun. This presents the open needed by the Marchand type balun at high frequency and provides the needed grounds for the back-wave balun at low frequency. Capacitances 126a and 128a provide a short at high frequency in the nature of a Marchand balun and an open at low frequency in the nature of a back-wave balun. Thus, they present the open needed for back-wave at low frequency and the short needed for the Marchand balun at high frequency. Hybrid balun 50b is shown as a lumped element version but it too, of course, may be implemented in a distributed version.

Figure 6:
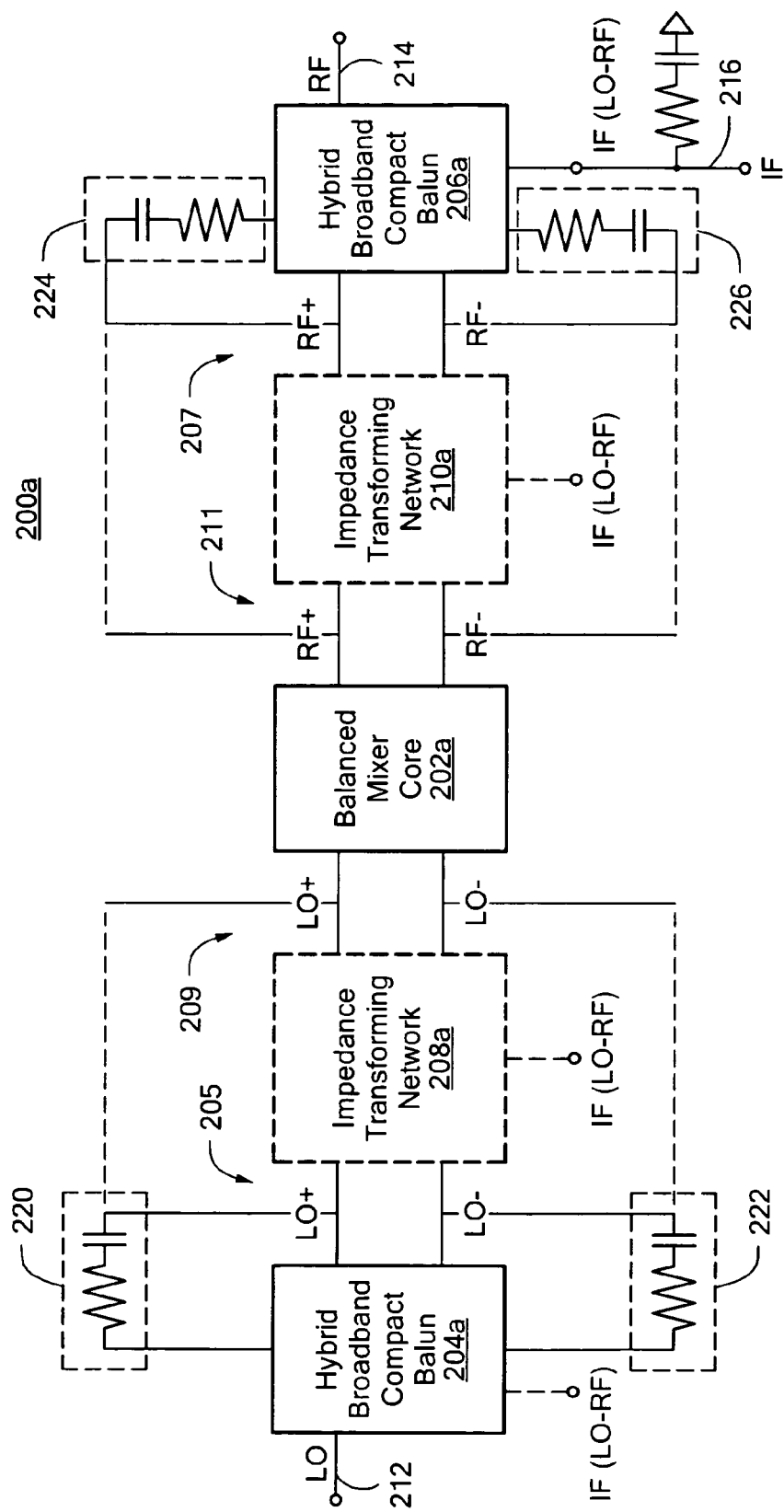
FIG. 6 is a block diagram of a double balanced mixer according to this invention.

In accordance with one embodiment of the invention, a double balance mixer 200a, FIG. 6, includes a balanced mixer core 202a being supplied by first and second baluns 204a and 206a which may include various types of baluns, such as a Marchand, back/wave or hybrid balun. Baluns 204a and 206a provide a balanced or differential output on lines 205 and 207, respectively. Balun 204a includes a first RC network 220 coupled between at least one of the ports of the first balanced output 205 and one of ground and a common mode node of the first balun to improve the linearity of the double balanced mixer. Balun 204a may also include a second RC network 222 also coupled between at least one of the ports of the first balanced output 205 and one of ground and a common mode node of the balun 204a. Balun 206a may also include a first and/or second RC networks 224 and 226 each coupled between at least one of the ports of the second balanced output 207 and one of ground and a common mode node of the balun 206a. RC networks 220-226 improve the linearity of a double balanced mixer, especially the output IP3. Another benefit of RC networks 220-226 is the isolation between the ports of mixer core 202a can be improved at specified frequency without affecting other aspects of the performance. Although FIG. 6 shows two baluns 204a and 206a, the use of two baluns is not a limitation of the invention as mixer core 202a may be responsive to only one balun 204a or 206a and another balanced or a signal ended signal.

There optionally may also be impedance transforming networks 208, 210 as conventionally used. In this case, RC networks 220-226 may be coupled to one or both of the ports of the corresponding differential output 205 or 207 or to one or both of the ports of the corresponding differential output 209 or 211 from the impedance transforming networks 208, 210.

The balanced mixer core 202a of conventional design can be either diode based or FET based. One input, LO, is provided at port 212; the other input to be mixed, RF, is provided at port 214. These are single ended ports in this embodiment. Hybrid balun 204 provides differential or balanced outputs LO+ and LO− which are delivered to balanced mixer core 202. Hybrid balun 206 receiving input RF at port 214 provides a balanced or differential output RF+ and RF−. This mixer 200 with the use of the baluns according to this invention provides good isolation of LO and RF and it also provides improved broad band mixed signal output LO-RF, or IF. The IF output being provided at balun 206 is typically a common mode signal and can be extracted elsewhere. That is, the location of the IF port 216 can be changed according to application requirements. It's possible to extract the IF signal either from the LO side of the balun or from the impedance transforming networks 208 or 210 or from the mixer core 202. The IF signal can also be single ended or balanced or differential.

Figure 7:
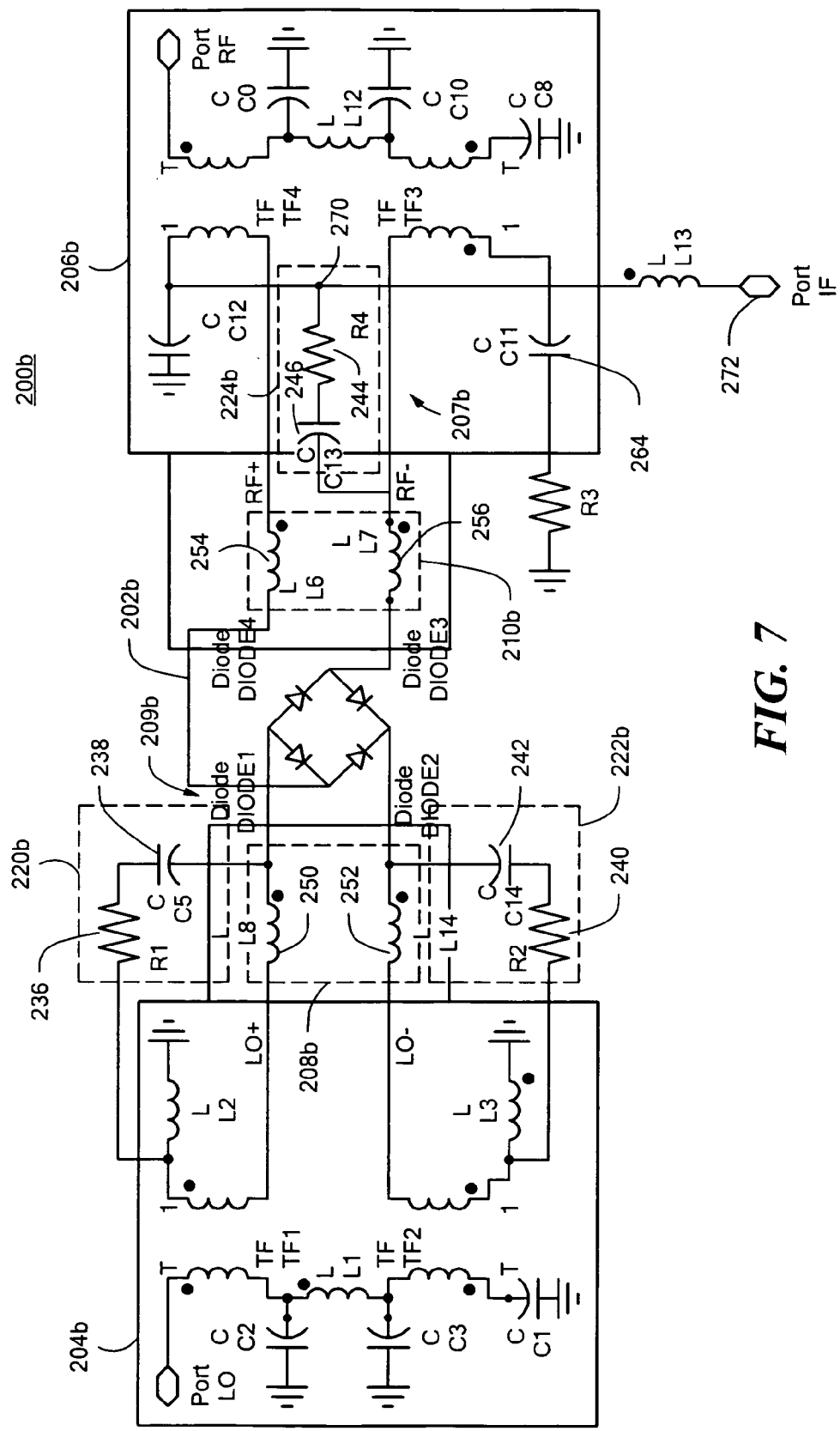
FIG. 7 is a schematic diagram of a more detailed double balanced mixer according to one embodiment of this invention.

FIG. 7 shows the detailed schematic of one version of double balanced mixer 200b based on the hybrid balun. Such a double balance mixer 200b, FIG. 7, includes a balanced diode mixer core 202b being driven by two hybrid baluns 204b and 206b. Balun 204b includes a first RC network 220b including resistor 236 and capacitor 238 coupled in series between port 230 of the balanced output 209b and the common mode node 234a of the balun 204b. Balun 204a also includes a second RC network 222b including resistor 240 and capacitor 242 coupled in series between port 232 of the balanced output 209b and common mode node 234b of the balun 204b. Balun 206a includes a RC network 224 including resistor 244 and capacitor 246 coupled in series between a port of the balanced output 207b and a common mode node of the balun 206a.

The impedance transforming network 208b on the LO side is implemented using a low-pass network including inductors 250 and 252. The impedance transforming network 210a on the RF side is implemented using a low-pass network including inductors 254 and 256. The central common node 270 is used as the IF port 272 to extract the low-frequency mixed product (LO-RF) of LO and RF signals. Filtering capacitor 264 helps to filter out the high order mixed products as well as LO and RF leakages at the IF port 272.

Figure 8:
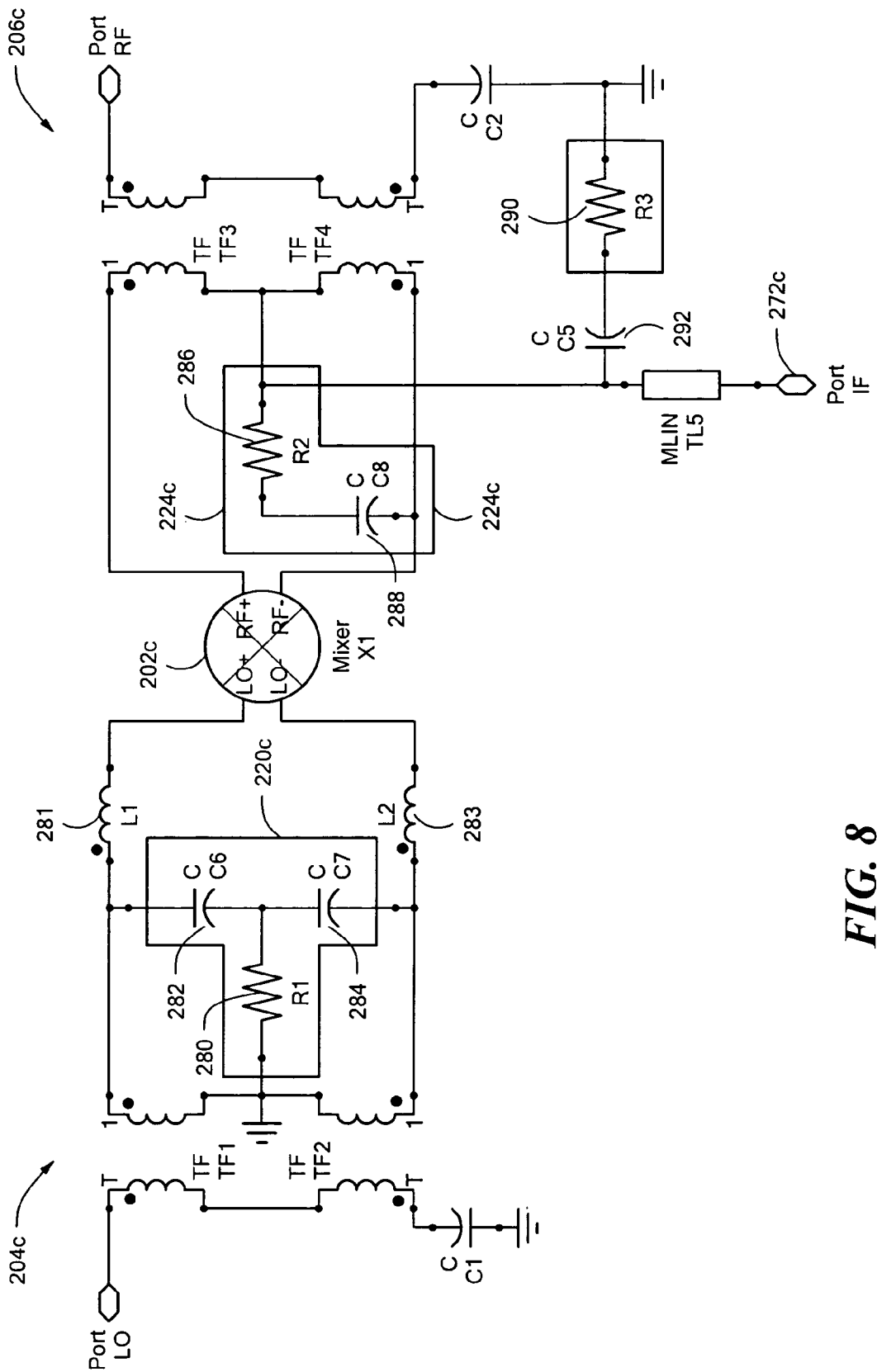
FIG. 8 is a schematic diagram of another example of a double balanced mixer according to an embodiment of this invention.
Figure 9:
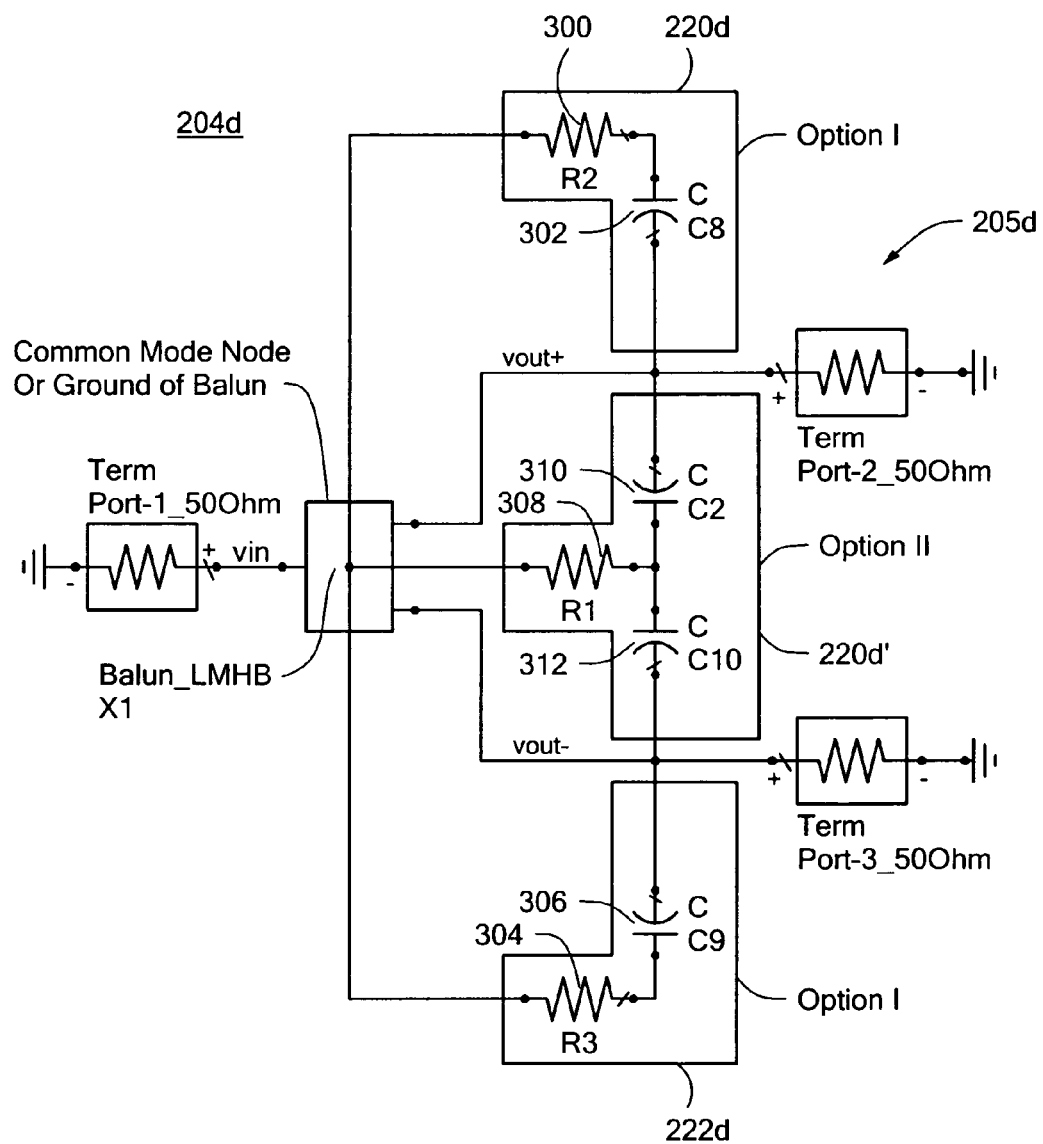
FIG. 9 is an example of a 50 ohm to 50 ohm single-ended-to-balanced or differential balun which may be used with the double balanced mixer of FIG. 6.

In accordance with another embodiment of the invention, a double balance mixer 200c, FIG. 8, includes baluns 204c and 206c. Balun 204c includes a first RC network 220c including resistor 280 coupled between ground and a common node between capacitors 282 and 284 which are each coupled to one of the ports of balanced output 205c. In addition to inductors 281 and 283, capacitors 282 and 284 also provide matching for the differentially driven signal on the LO side. Balun 206c includes a RC network 224c including resistor 286 and capacitor 288 coupled in series between one port of the balanced output 207c and a common mode node of the balun 206c. To provide additional linearity, resistor 290 may be coupled in series with capacitor 292 at IF port 272c.

FIGS. 9-13B illustrate how various baluns may be modified in accordance with the subject invention. For example, balun 204d may include first and second RC networks 220d and 222d which each include a resistor 300 and 304 and capacitor 302 and 306, respectively, coupled in series between a port of balanced output 205d and a common mode node or ground of balun 204d. Alternatively, balun 204d may include RC network 220d' which includes resistor 308 coupled between ground or a common mode node of balun 204d and a common node between capacitors 310 and 312 which are each coupled to one of the ports of balanced output 205d.

Figure 10A:
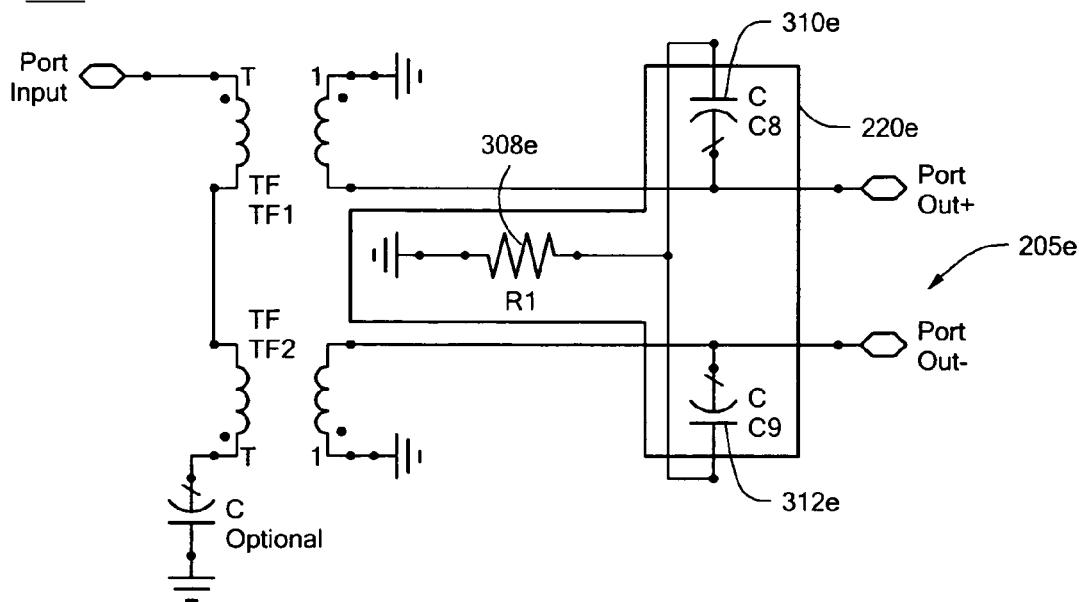
FIGS. 10A and 10B are schematic diagrams of modified Marchand balun which may be used with the double balanced mixer of FIG. 6.
Figure 10B:
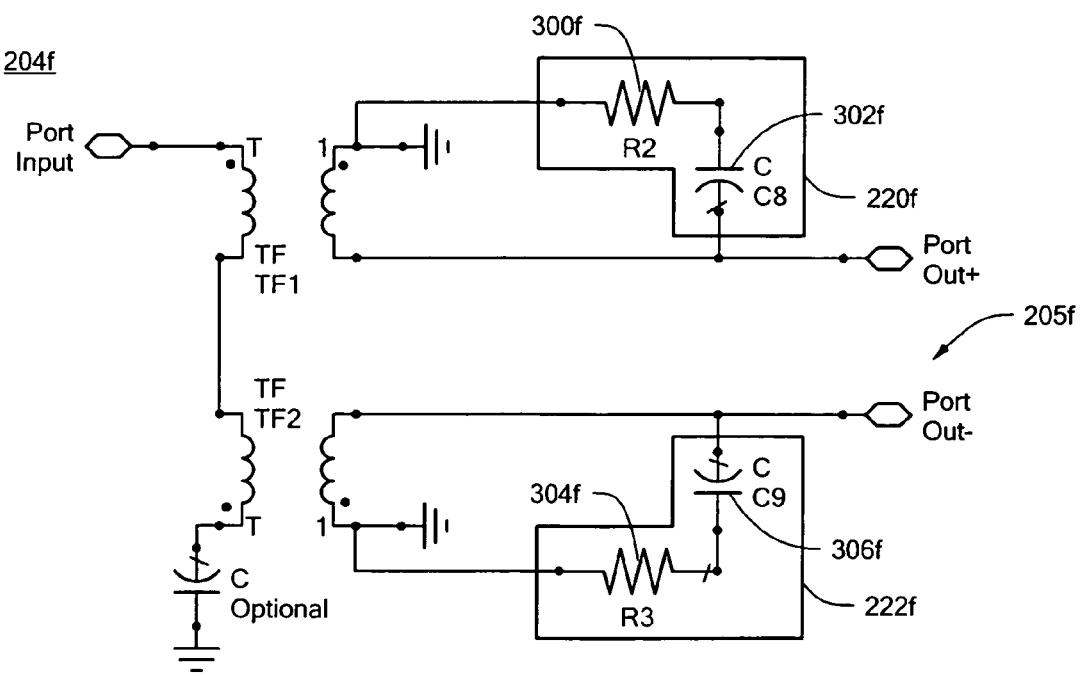

Modified Marchand balun 204e, FIG. 10A, may include RC network 220e which includes resistor 308e coupled between ground and a common node between capacitors 310e and 312e which are each coupled to one of the ports of balanced output 205e. Alternatively, modified Marchand balun 204f, FIG. 10B, may include first and second RC networks 220f and 222f which each include a resistor 300f and 304f and capacitor 302f and 306f, respectively coupled in series between a port of balanced output 205f and ground.

Figure 11A:
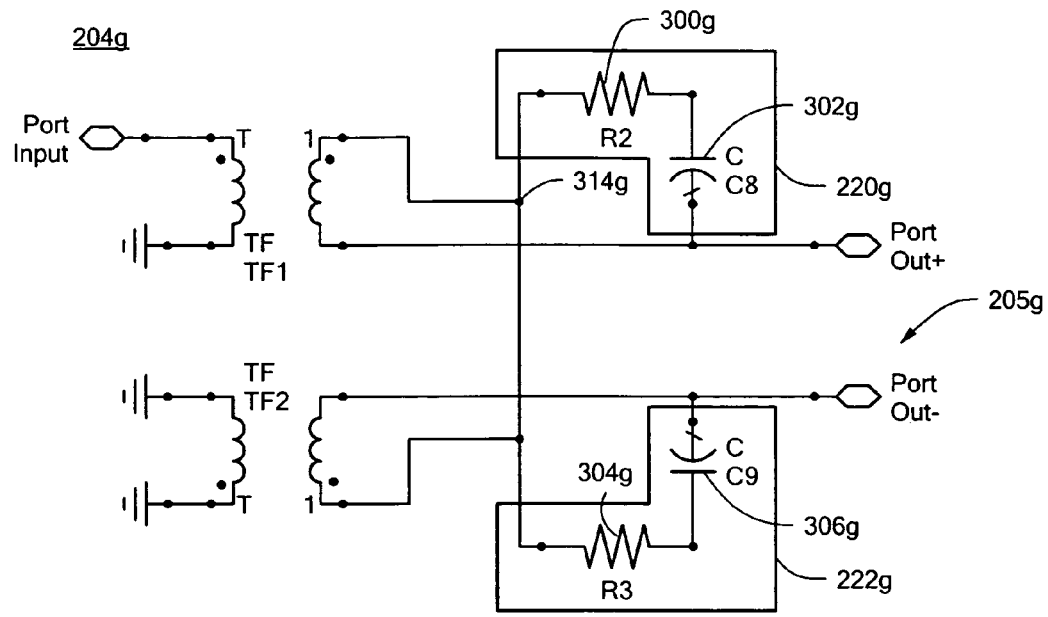
FIGS. 11A and 11B are schematic diagrams of a modified lumped back-wave balun which may be used with the double balanced mixer of FIG. 6.
Figure 11B:
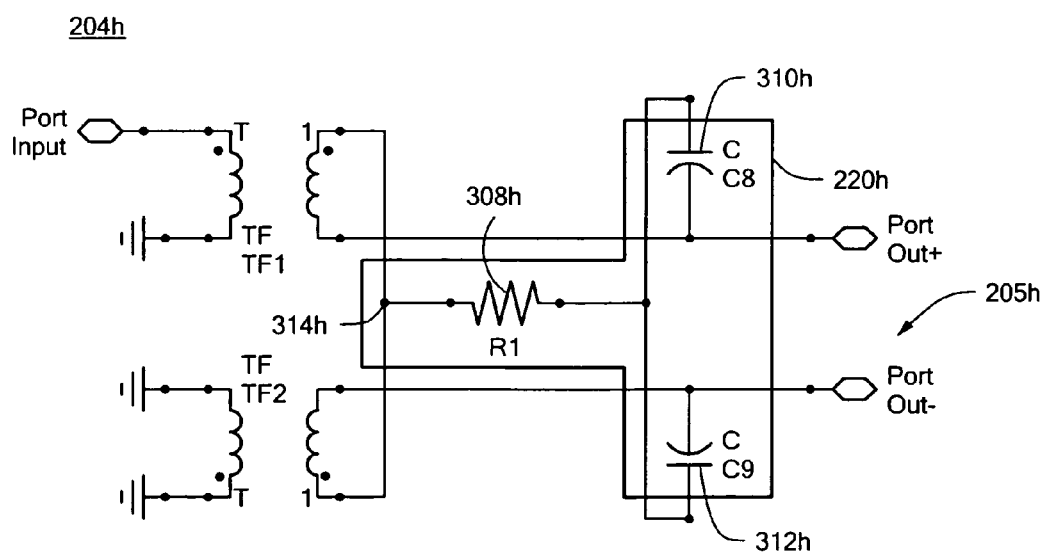

Modified back-wave balun 204g, FIG. 11A, includes first and second RC networks 220g and 222g which each include a resistor 300g and 304g and capacitor 302g and 306g, respectively, coupled in series between a port of balanced output 205g and a common mode node 314g of balun 204g. Alternatively, modified back-wave balun 204h, FIG. 11B, includes RC network 220h which includes resistor 308h coupled between a common mode node 314h of balun 204h and a common node between capacitors 310h and 312h which are each coupled to one of the ports of balanced output 205h.

Figure 12A:
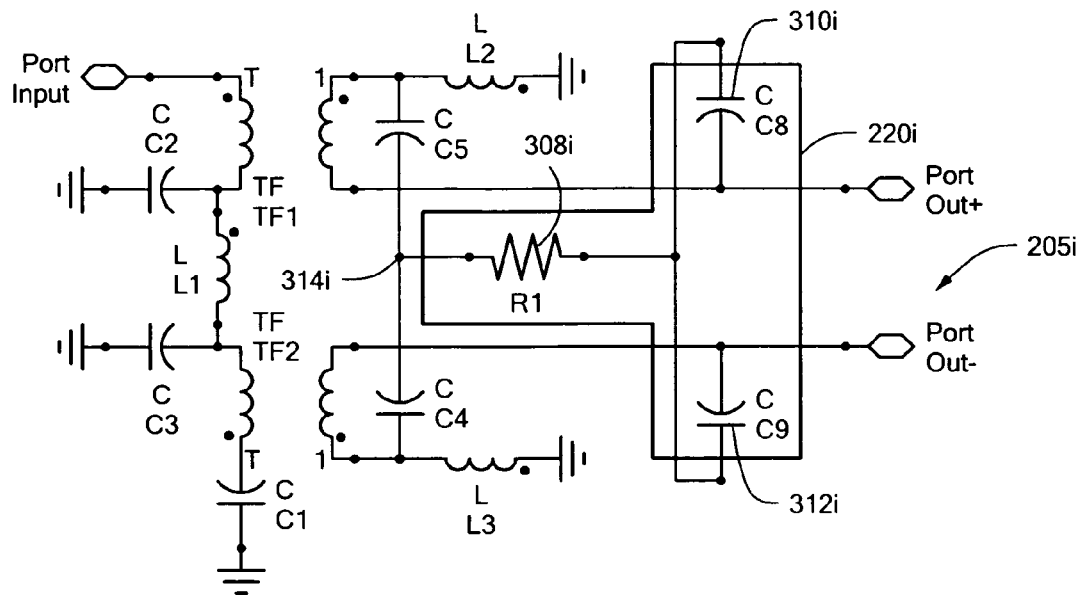
FIGS. 12A and 12B are schematic diagrams of a modified hybrid Marchand/back-wave balun which may be used with the double balanced mixer of FIG. 6.
Figure 12B:
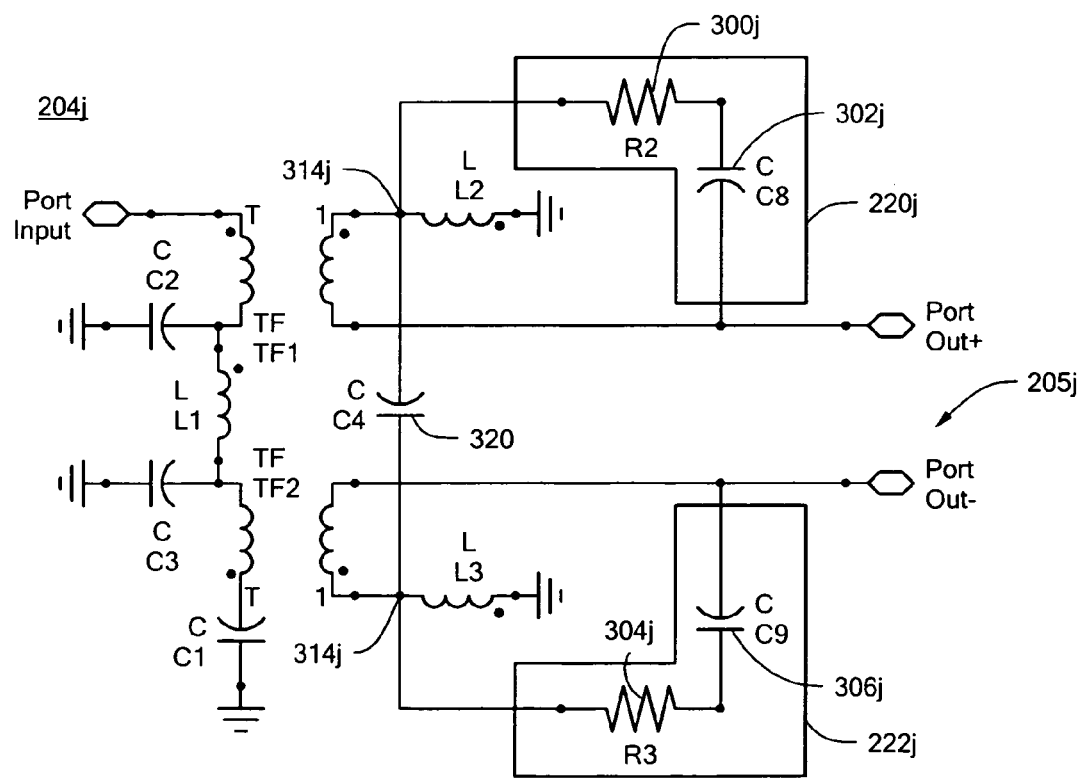

Modified hybrid Marchand/back-wave balun 204i, FIG. 12A, may include RC network 220i which includes resistor 308i coupled between a common mode node 314i of balun 204i and a common node between capacitors 310i and 312i which are each coupled to one of the ports of balanced output 205i. Alternatively, modified hybrid Marchand/back-wave balun 204j, FIG. 12B, may include first and second RC networks 220j and 222j which each include a resistor 300j and 304h and capacitor 302j and 306j, respectively, coupled in series between a port of balanced output 205j and a common mode node 314j, 314j' of balun 204j. It should be noted that nodes 314j, 314j' of Marchand/back-wave balun 204j act as a common mode node at high frequencies because capacitor 320 appears to be a short circuit.

Figure 13A:
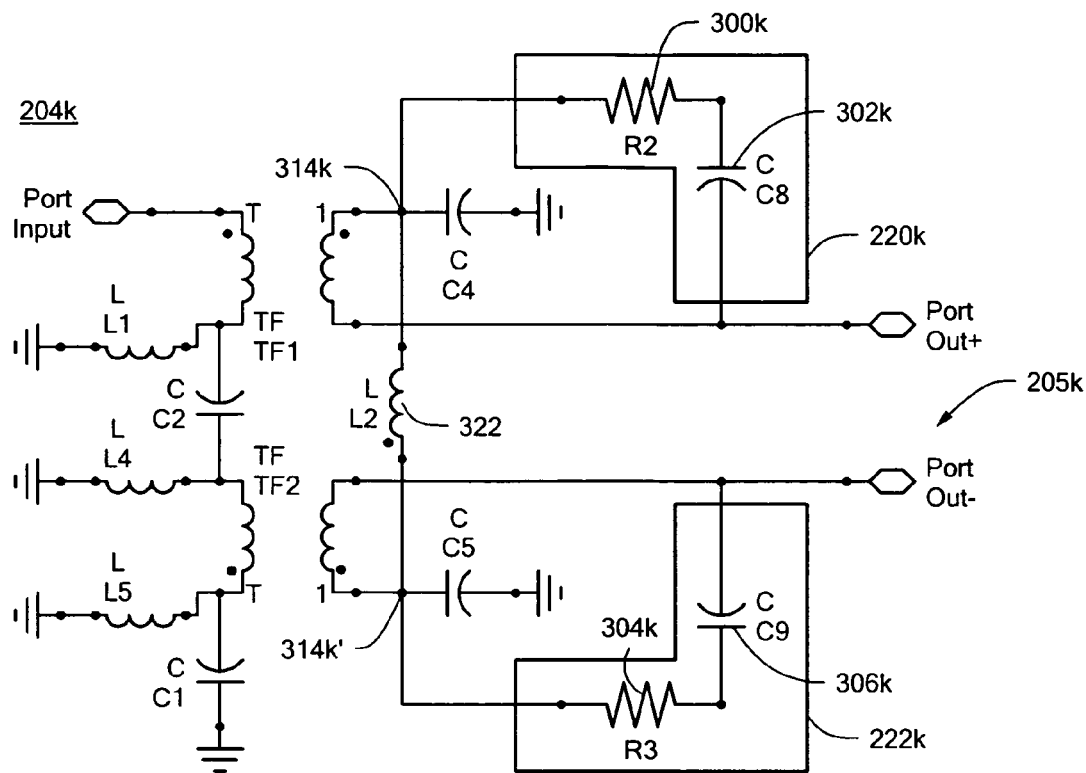
FIGS. 13A and 13B are schematic diagrams of a modified hybrid Marchand/back-wave balun which may be used with the double balanced mixer of FIG. 6.

In another embodiment, modified hybrid Marchand/back-wave balun 204k, FIG. 13A, includes first and second RC networks 220k and 222k which each include a resistor 300k and 304k and capacitor 302k and 306k, respectively coupled in series between a port of balanced output 205k and a common mode node 314k, 314k' of balun 204k. Nodes 314j, 314j' of Marchand/back-wave balun 204j act as a common mode node at low frequencies because inductor 322 appears to be a short circuit.

Figure 13B:
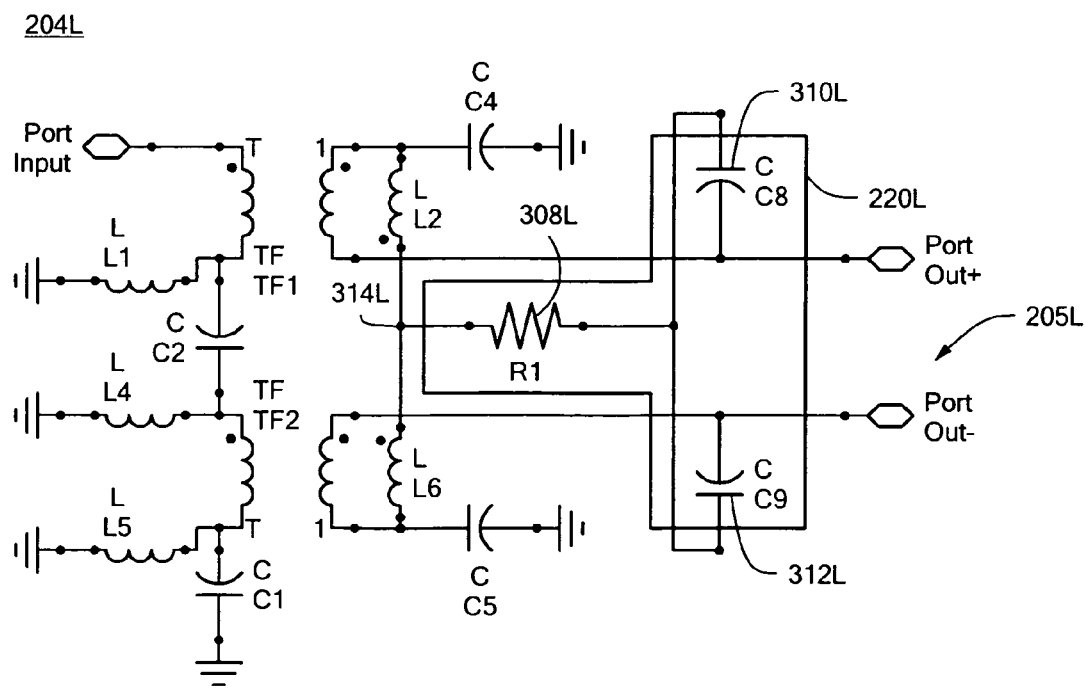

Alternatively, modified hybrid Marchand/back-wave balun 204L, FIG. 13B, includes RC network 220L which includes resistor 308L coupled between common mode node 314L of balun 204L and a common node between capacitors 310L and 312L which are each coupled to one of the ports of balanced output 205L.

Figure 14:
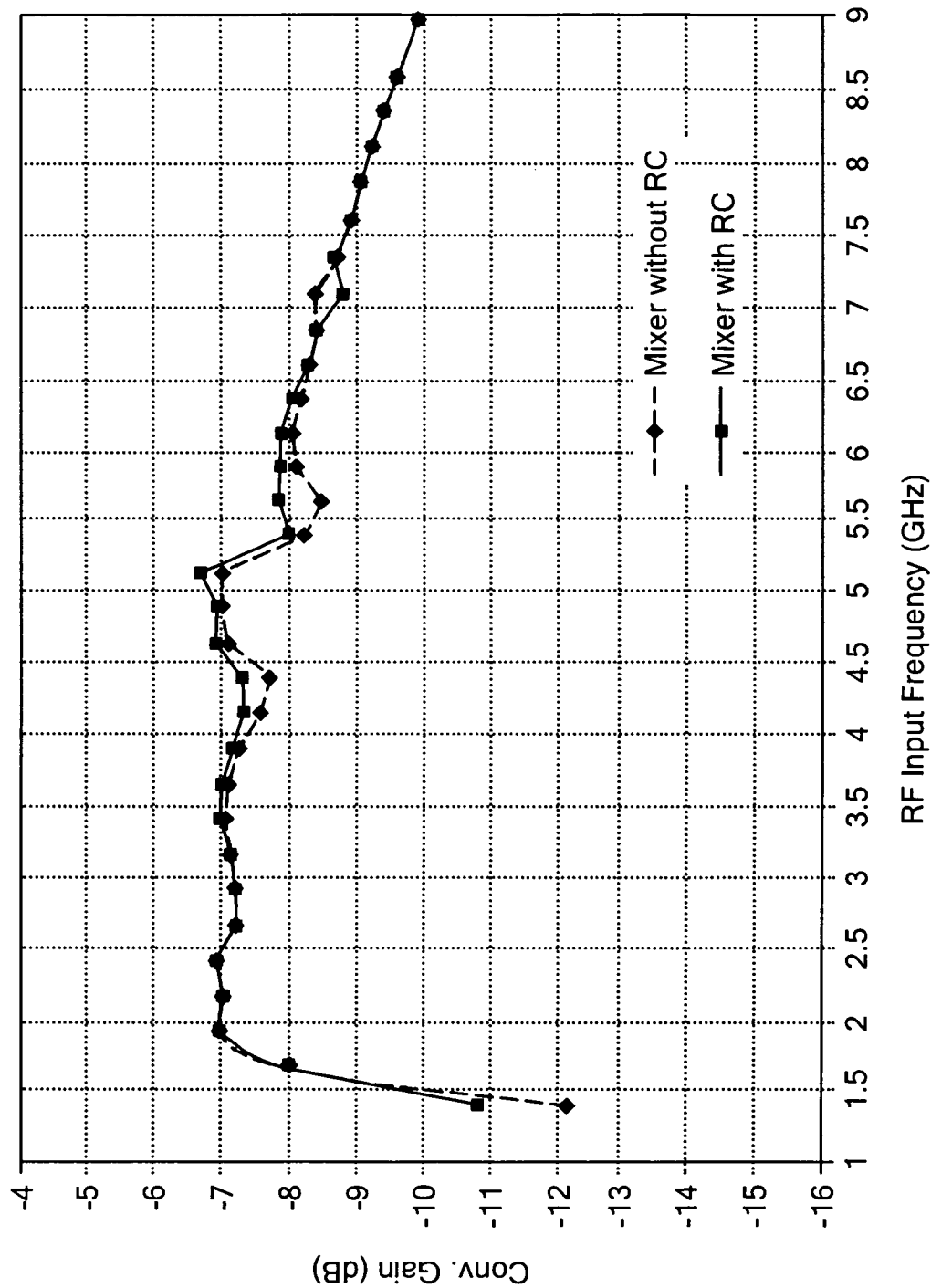
FIG. 14 is a graph showing the improved conversion gain of the double balanced mixer of FIG. 6.

The signal converting efficiency and other performances of the balanced mixer of FIG. 6 are shown in FIGS. 14 through 17. FIG. 14 shows the conversion gain performance comparison of mixers built with and without the RC network according to embodiments of the invention. No degradation in conversion gain occurs by using the subject RC network to improve linearity.

Figure 15:
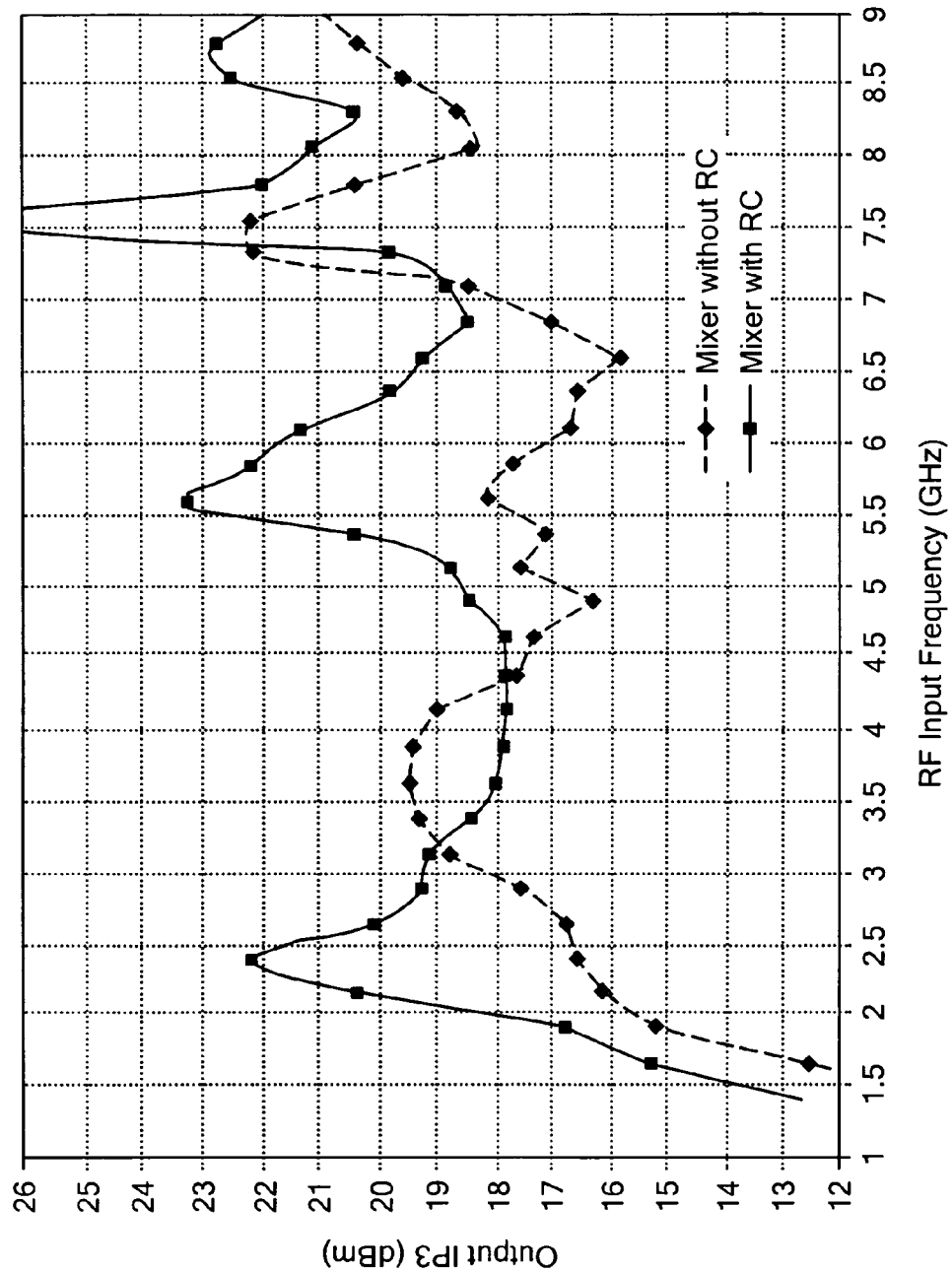
FIG. 15 is a graph showing the improved output IP3 of the double balanced mixer of FIG. 6.

FIG. 15 illustrates the output IP3 performance comparison of mixers built with and without the subject RC network. Improvement of 2 dB in the output IP3 at the worst case scenario is observed by using the subject RC network. In addition, much higher values of output IP3 have been achieved across the entire bandwidth with a mixer including the subject invention in comparison to mixers without subject RC network.

Figure 16:
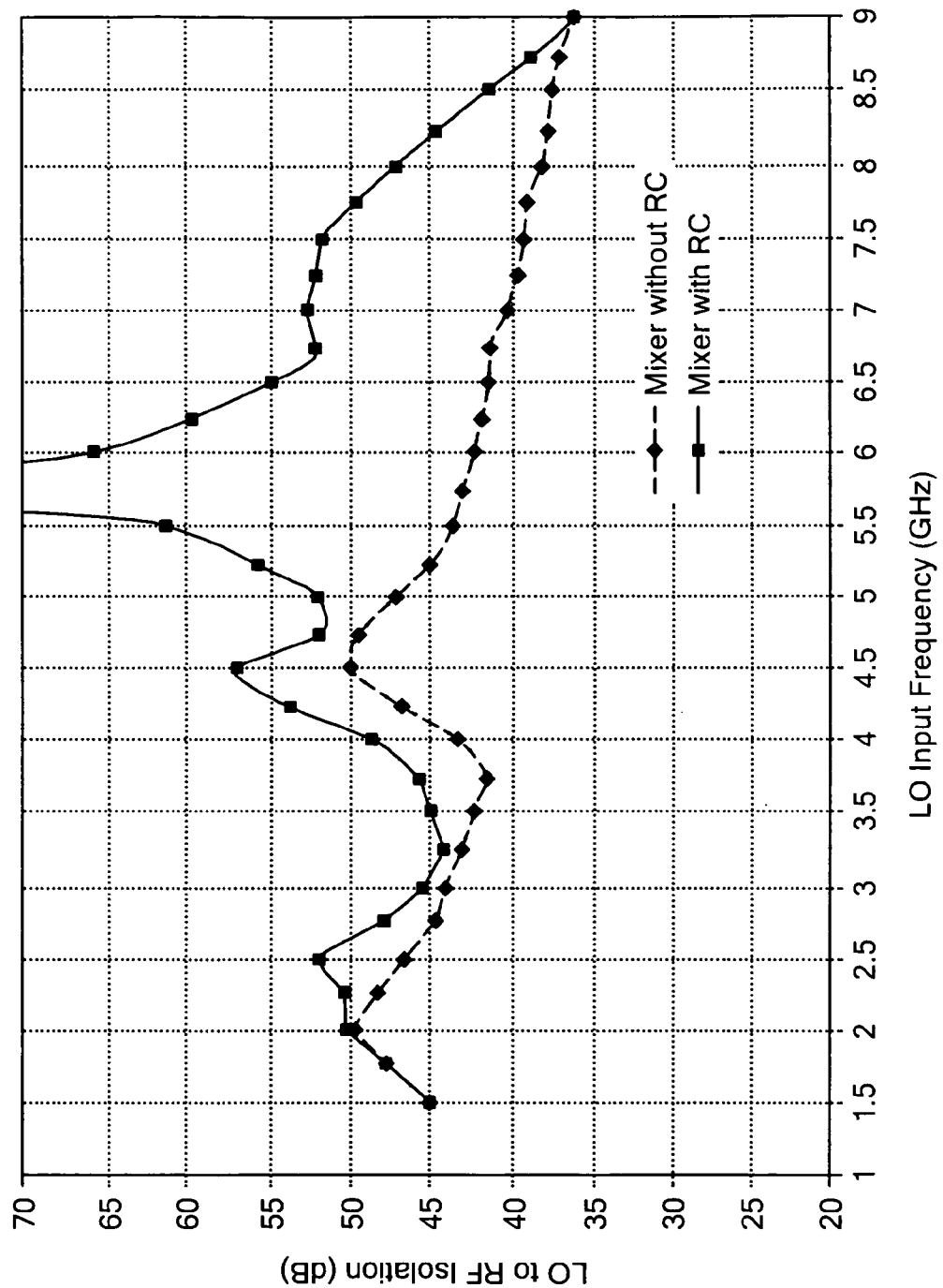
FIG. 16 is a graph showing the improved RF port isolation of the double balanced mixer of FIG. 6.

FIG. 16 illustrates the LO to RF isolation comparing mixers built with and without the RC network according to embodiments of the subject invention. Improvement of 3 dB at the worst case scenario is observed by using the subject RC network. In addition, much higher values of LO to RF isolation have been achieved across the entire bandwidth with a mixer including the subject invention in comparison to mixers without subject RC network.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. An improved double balanced mixer, comprising:
a first balun for receiving a first single input and providing a first balanced output having two ports;
a second balun for receiving a second single input and providing a second balanced output having two ports;
a balanced mixer core responsive to said first and second balanced outputs to provide a mixed signal from said first and second single inputs; and
the first balun including a first RC network coupled between both of the ports of the first balanced output and one of ground and a common mode node of the first balun to improve the linearity of the double balanced mixer.

2. The improved double balanced mixer of claim 1 in which said second balun includes a second RC network coupled between at least one of the ports of the second balanced output and one of ground and a common mode node of the second balun.

3. The improved double balanced mixer of claim 1 in which the first balun includes a Marchand balun.

4. The improved double balanced mixer of claim 1 in which the first balun includes a back-wave balun.

5. The improved double balanced mixer of claim 1 in which the first balun includes a hybrid Marchand/back-wave balun.

6. The improved double balanced mixer of claim 5 in which each of said baluns includes a hybrid Marchand/back-wave balun which includes:
a first pair of coupled sections having a first primary section and first secondary section;
a second pair of coupled sections having a second primary section and second secondary section;
a first reactance interconnecting said first and second primary sections and a second reactance interconnecting said first and second secondary sections;
one of said reactances being open at high frequency and shorted at low frequency, the other reactance being shorted at high frequency and open at low frequency for selectively providing low frequency Marchand/high frequency back-wave function and high frequency Marchand/low frequency back-wave function.

7. The improved double balanced mixer of claim 6 in which said first reactance is an inductive reactance, said second reactance is a capacitive reactance and said balun functions as a Marchand balun at low frequency and a back-wave balun at high frequency.

8. The improved double balanced mixer of claim 6 in which said first reactance is a capacitive reactance, said second reactance is an inductive reactance and said balun functions as a Marchand balun at high frequency and a back-wave balun at low frequency.

9. The improved double balanced mixer of claim 6 in which one of the first and second reactances is a capacitive reactance and the other is an inductive reactance and they are implemented by parasitic capacitance and parasitic inductance of the coupled sections, respectively.

10. The improved double balanced mixer of claim 1 further including an impedance transforming network interconnected between said balanced mixer core and said balanced outputs of each of said baluns.

11. An improved double balanced mixer, comprising:
a first balun for receiving a first single input and providing a first balanced output having two ports;
a balanced mixer core responsive to said first balanced output and a second balanced output to provide a mixed signal from said first and second balanced outputs; and
the first balun including a first RC network coupled between both of the ports of the first balanced output and one of ground and a common mode node of the first balun to improve the linearity of the double balanced mixer.

12. The improved double balanced mixer of claim 11 further including a second balun for receiving a second single input and providing the second balanced output having two ports, said second balun including a second RC network coupled between at least one of the ports of the second balanced output and one of ground and a common mode node of the second balun.

13. The improved double balanced mixer of claim 11 in which the first balun includes a Marchand balun.

14. The improved double balanced mixer of claim 11 in which the first balun includes a back-wave balun.

15. The improved double balanced mixer of claim 11 in which the first balun balun includes a hybrid Marchand/backwave balun.

16. An improved double balanced mixer, comprising:
   a first balun for receiving a first single input and providing a first balanced output having two ports;
   a second balun for receiving a second single input and providing a second balanced output having two ports;
   a balanced mixer core responsive to said first and second balanced outputs to provide a mixed signal from said first and second single inputs;
   the first balun including a first RC network coupled between both of the ports of the first balanced output and one of ground and a common mode node of the first balun to improve the linearity of the double balanced mixer; and
   said second balun including a second RC network coupled between at least one of the ports of the second balanced output and one of ground and a common mode node of the second balun.

17. The improved double balanced mixer of claim 16 in which the first RC network includes resistor and capacitor coupled in series to one of the ports of the first balanced output.

18. The improved double balanced mixer of claim 16 in which the first RC network includes a resistor coupled to a common node of two coupled capacitors, each of which is coupled to a port of the first balanced output.

19. The improved double balanced mixer of claim 16 in which the first RC network includes a resistor coupled to a common node of two coupled capacitors, each of which is coupled to a port of the first balanced output.

\* \* \* \* \*